United States Patent [19]

Saar

[11] Patent Number: 4,628,421

[45] Date of Patent: Dec. 9, 1986

[54] STRIP LIGHTING

[76] Inventor: Lawrence E. Saar, 810 Second Ave., Bensenville, Ill. 60106

[21] Appl. No.: 821,784

[22] Filed: Jan. 23, 1986

[51] Int. Cl.⁴ ............................................. F21V 19/06
[52] U.S. Cl. ..................... 362/238; 362/249; 313/251; 313/268; 339/157 R; 339/174
[58] Field of Search ............... 362/227, 234, 237, 238, 362/249, 252, 806; 313/250, 251, 269, 268, 285, 267; 339/157 R, 174

[56] References Cited

U.S. PATENT DOCUMENTS

| | | |
|---|---|---|
| 2,506,620 | 5/1950 | Sundt . |
| 2,514,892 | 7/1950 | Miller et al. .................... 362/247 |
| 3,493,926 | 2/1970 | Morena . |
| 3,873,885 | 3/1975 | Elfverson ...................... 315/312 |
| 4,173,035 | 10/1979 | Hoyt . |
| 4,197,154 | 4/1980 | Pfaff, Jr. ....................... 156/355 |
| 4,204,273 | 5/1980 | Goldberg ...................... 362/249 |
| 4,488,207 | 12/1984 | Harmon ........................ 362/308 |
| 4,514,791 | 4/1985 | Tokieda . |
| 4,521,838 | 6/1985 | Agabekov . |

Primary Examiner—Larry I. Schwartz
Attorney, Agent, or Firm—Emrich & Dithmar

[57] ABSTRACT

A modular low voltage light strip includes an elongated, linear housing open along an upper portion thereof which is adapted to receive an elongated, linear circuit board. The circuit board includes a plurality of spaced apertures along its length and a plurality of conductive strips on a first lower surface thereof extending the length of the circuit board. A conductive mounting spring is positioned over each aperture on a second upper surface of the circuit board, is connected in circuit with one of the conductive strips, and is adapted to receive a threaded base or socket of a lamp in providing for the secure mounting thereof upon the circuit board and its electrical connection to a respective first conductive strip. With the lamp thus engaged by a respective mounting spring, its bottom terminal is positioned within an associated circuit board aperture and in contact with a second conductive strip. A single concave, elongated, linear reflector having a plurality of spaced apertures along its length is positioned along the open upper portion of the housing with each aperture adapted to receive a respective lamp inserted therethrough so as to cover the circuit board and to provide a continuous, attractive, high illumination reflecting surface for the lamps. A transparent, snap-acting cover is adapted for secure engagement with the housing along the upper open portion thereof so as to form an enclosed structure within which the reflector, the lights and the circuit board are fixedly disposed.

16 Claims, 6 Drawing Figures

U.S. Patent    Dec. 9, 1986    4,628,421
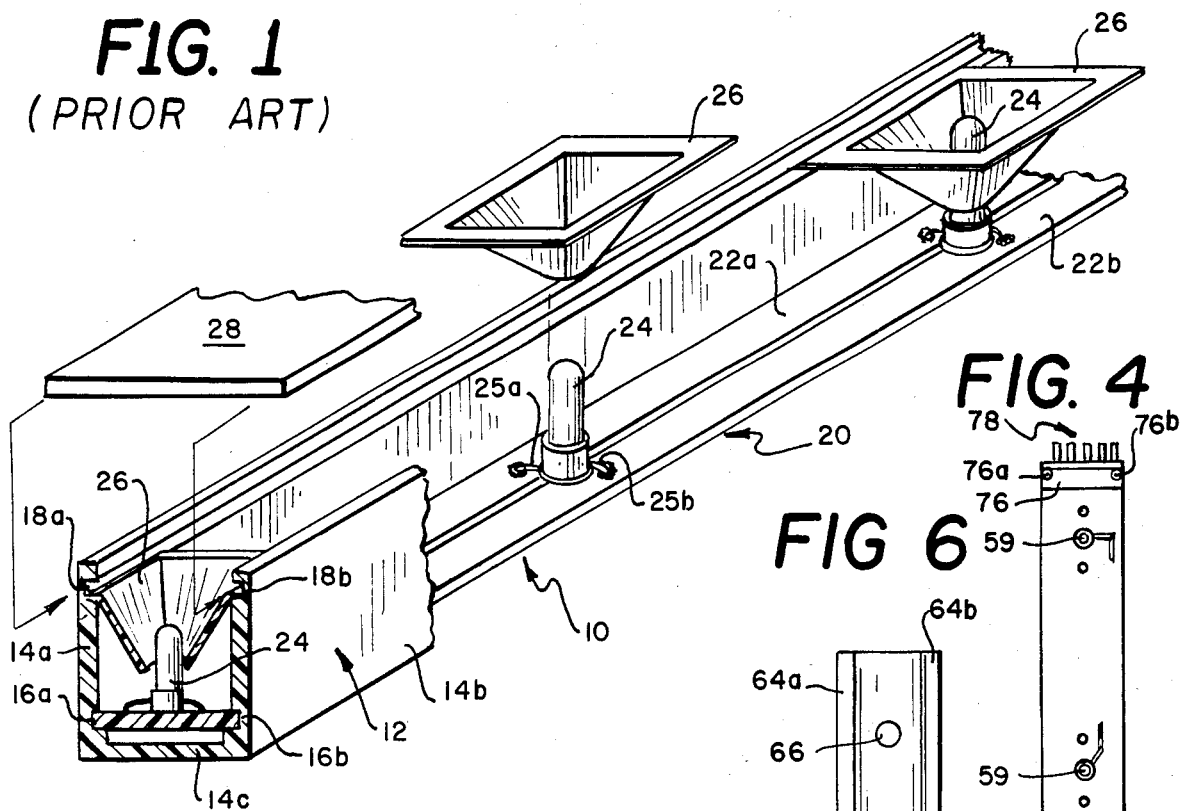
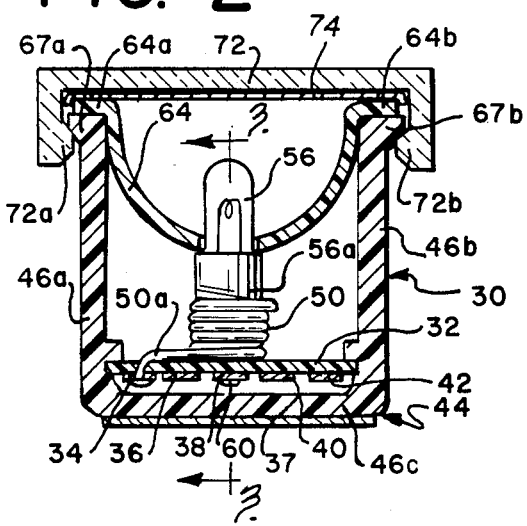
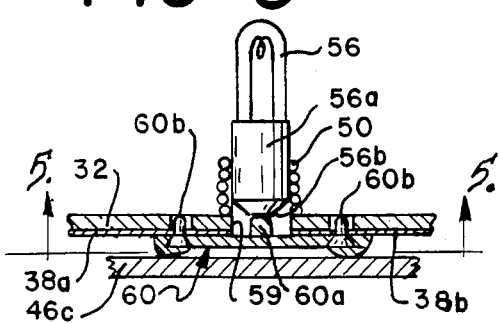
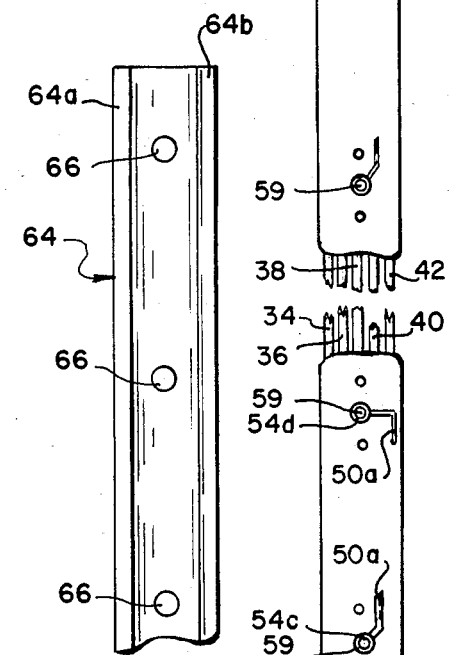
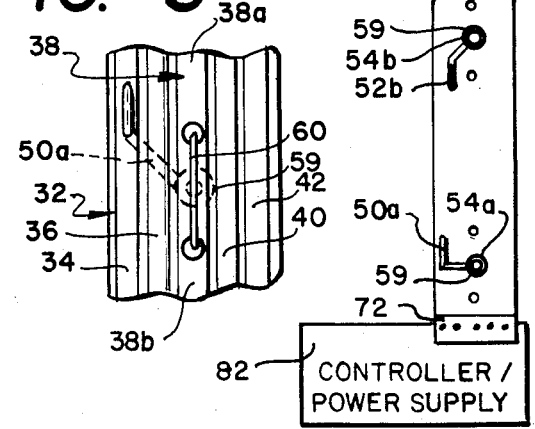

STRIP LIGHTING

BACKGROUND OF THE INVENTION

This invention relates generally to lighting systems and is particularly directed to an improved strip lighting arrangement.

Strip lighting systems generally include a number of lamps, or light bulbs, aligned in an elongated array and connected in circuit to a common controller/power supply. Strip lighting systems have various commercial applications such as in advertisements, marquees, signs, etc., and are commonly used in noncommercial environments such as for decorative illumination as well as in functional applications such as in lighting stairways or other areas where only limited illumination is desired. These lighting systems generally operate at low voltages and currents, e.g., 24 VAC and 10 amps, with the controller frequently operated in a timed manner to sequentially and repetitively energize each lamp so as to provide a light "chasing" effect. The most common light "chasing" arrangement makes use of four separate circuits with each circuit coupled to every fourth lamp to simultaneously illuminate all lamps coupled to a first circuit for a first short time interval, followed by illumination of all lamps coupled to a second circuit for a second short time interval, etc. Such lighting arrangements and sequential illumination patterns are well known. However, prior art strip lighting systems have suffered from various limitations which have somewhat limited their general acceptance.

Referring to FIG. 1, there is shown a partially cut-away, exploded perspective view of a prior art strip lighting system 10. The strip lighting system 10 includes an elongated, linear housing 12 generally comprised of first and second lateral panels 14a, 14b and a bottom panel 14c. The first and second lateral panels 14a, 14b are coupled to the bottom panel 14c so as to provide an upper portion of the housing 12 with a slot-like aperture extending the length of the housing. An upper, inner portion of the housing 12 is provided with a first, upper pair of facing slots 18a, 18b in the first and second panels 14a, 14b, respectively. Similarly, an inner, lower portion of the housing is provided with a second, lower pair of facing slots 16a, 16b in the first and second lateral panels 14a, 14b, respectively. The second, lower pair of facing slots 16a, 16b is adapted to receive and engage an elongated, flat printed circuit board 20 whereon are positioned first and second conductive strips 22a and 22b. Positioned along the length of the circuit board 20 in spaced relation are a plurality of apertures within each of which is positioned a respective lamp 24. Each lamp is provided with a pair of conductive leads 25a, 25b which are respectively coupled in a conventional manner such as by soldering to first and second conductive strips 22a, 22b. In this manner, each lamp 24 is mounted to and coupled in circuit with the circuit board 20.

An AC voltage is applied across the first and second conductive strips 22a, 22b as well as across the various lamps 24 electrically coupled thereto for illuminating each of the lamps. An inverted four-sided, generally pyramidal-shaped reflector 26 having an aperture in the apex thereof is positioned over each of the lamps 24 such that a lamp is positioned within and extends through the aperture therein. The upper surface of each of the reflectors 26 is typically provided with a highly reflective coating. The second, upper pair of facing slots 16a, 16b is adapted to receive in sliding engagement respective edges of a generally flat light transmitting cover 28. The light transmitting cover may be either transparent or translucent depending upon the desired appearance of the strip lighting system and the application in which it is used.

The prior art strip lighting system of FIG. 1 suffers from various limitations. For example, by soldering each lamp to the conductors on the circuit board, replacement of the lamps following burn-out is difficult at best and is frequently impossible for the lamp user to perform. The soldered connection of the lamp leads also increases manufacturing time and cost and introduces the possibility of human error in the fabrication of the lighting circuit. Imprecise placement and soldering of a lamp on the circuit board may result in a shorting out of the lamp when power is applied to the strip lighting system. In addition, the sliding engagement of the light transmitting cover 28 as well as the circuit board 20 with the housing 12 precludes access to the lamps and removal of the circuit board from the housing where there is limited space at each end of the housing. Finally, the individual reflectors positioned immediately adjacent to each of the lamps provide only limited, discontinuous reflected illumination and, since the reflectors are not securely coupled to another structure in the lighting system, prevent usage of the lighting system in any lamp orientation other than generally vertical. Moreover, when the light transmitting cover 28 is removed from the housing 12, the individual reflectors 28 may be easily dislodged and become separated from the strip lighting assembly. The discontinuous nature of the reflector arrangement also exposes the underlying circuit board reducing the aesthetic appeal of this configuration.

The present invention is intended to overcome the aforementioned limitations of the prior art by providing an improved strip lighting arrangement which is easily, reliably and inexpensively fabricated and permits easy lamp replacement and electrical circuit maintenance in a sealed, attractive, high illumination and structurally strong and durable configuration.

OBJECTS AND SUMMARY OF THE INVENTION

A principal object of the present invention is to provide an improved strip lighting arrangement.

It is another object of the present invention to provide a strip lighting arrangement which is durable, attractive, and is adapted for low cost, mass production.

A further object of the present invention is to provide an improved strip lighting arrangement having a concave, unitary reflector for enhanced illumination and improved aesthetics.

Yet another object of the present invention is to provide an improved strip lighting arrangement which affords easy access to the lamps and electrical circuitry associated therewith to facilitate lamp replacement and circuit maintenance/repair.

A still further object of the present invention is to provide a strip lighting section having ends which are readily adapted for coupling to similar strip lighting sections to allow for strip lighting arrangements of virtually any length.

Another object of the present invention is to provide a more ruggedized and durable strip lighting arrangement wherein the various components are arranged in a self-supporting, interconnected configuration.

Yet another object of the present invention is to facilitate the assembly, repair and disassembly of a strip lighting arrangement in a closely spaced, confined environment.

Yet another object of the present invention is to provide for the more reliable and safe assembly of a strip lighting system.

A still further object of the present invention is to provide a modular strip lighting arrangement comprised of virtually any number of easily connected, end-to-end coupled, aligned lighting strips.

The present invention contemplates a strip lighting arrangement comprised of an elongated, plastic housing comprised of a bottom panel and two facing lateral panels defining an open, slot-like upper portion of the housing. Positioned in a lower portion of the housing is a circuit board having a plurality of conductive strips on a first surface and aligned along the length thereof. The circuit board further includes a plurality of spaced apertures therein. A center neutral conductor is aligned with and extends across each of the apertures and is in contact with one terminal of each of the lamps. Various other generally linear, "hot" conductors are positioned on the same side of the circuit board on each side of the center neutral conductor and form separate circuits. A plurality of spaced coiled springs are positioned on the other side of the circuit board over each of the apertures therein and are each adapted to securely engage the threaded base of a lamp which forms a second lamp terminal. One end of each of the springs is connected in circuit with a respective "hot" conductor to form a multi-circuit arrangement and allow for a "chasing effect" in the strip lighting arrangement when coupled to a timed controller/power supply. A single, strip-like, concave, chrome-plated reflector having a plurality of spaced apertures therein is positioned over the circuit board such that each lamp is positioned within a respective aperture in the reflector to provide illumination of the area above the reflector. A transparent cover to which a color gel may be affixed is securely positioned upon the upper portion of the housing in a snap-acting manner so as to cover the slot-like aperture therein and enclose the lamps and associated circuitry therein.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

DESCRIPTION OF THE DRAWINGS

The appended claims set forth those novel features believed characteristic of the invention. However, the invention itself, as well as further objects and advantages thereof will be best understood by reference to the following description of a preferred embodiment taken in conjunction with the accompanying drawings, where like reference characters identify like elements throughout the various figures, in which:

FIG. 1 is an exploded perspective view partially cut away of a prior art strip lighting system;

FIG. 2 is a sectional view of an improved strip lighting arrangement in accordance with the principles of the present invention;

FIG. 3 is a vertical sectional view taken along sight line 3—3 in FIG. 2 of the strip lighting arrangement of the present invention;

FIG. 4 is a top view shown partially in phantom of an elongated circuit board for use in the strip lighting arrangement of the present invention;

FIG. 5 is a bottom view shown partially in phantom of a lamp mounted to and electrically coupled to a circuit board as illustrated in FIG. 3 taken along sight line 5—5 therein; and FIG. 6 is a top view of an elongated, linear, concave reflector used in a preferred embodiment of the present invention.

DETAILED DESCRIPTION OF THE PREFERRED EMBODIMENT

Referring to FIGS. 2 and 3, there are shown vertical sectional views of the improved strip lighting arrangement 30 of the present invention and the manner in which a lamp 56 is mounted and coupled in circuit therein. The improved strip lighting system 30 includes an elongated housing 44 comprised of first and second lateral panels 46a, 46b and a bottom panel 46c. In combination, the lateral panels 46a, 46b and the bottom panel 46c form an integral structure having a slot-like aperture in an upper portion of the housing extending the length thereof. Positioned on upper, outer portions of each of the first and second lateral panels 46a, 46b are first and second flanges 67a, 67b, respectively. Each of the flanges 67a, 67b extends substantially the entire length of its associated lateral housing panel. The combination of the first and second lateral panels 46a, 46b and the bottom panel 46c provide the housing 44 with a generally slot-like configuration, which in many applications may be linear, although the present invention also contemplates the use of a housing having a generally curvilinear shape. To the bottom panel 46c of the housing 44 may be affixed a dual-sided mastic tape 37 for securely attaching the housing to a support structure (not shown).

The housing 44 is adapted to receive a generally flat, elongated printed circuit board 32 positioned therein. The printed circuit board 32 is aligned generally parallel to the bottom panel 46c of the housing 44 and generally conforms with the shape and dimensions of the inner portion of the housing. Positioned on a first, lower surface of the circuit board 32 are a plurality of spaced, elongated conductive strips or leads 34, 36, 38, 40 and 42 as shown in FIGS. 2 and 4. The aforementioned conductive strips are generally aligned along the length of the circuit board 32 and are each coupled to a controller/power supply 82 by means of a female connector 76. Also provided in the circuit board 32 along the length thereof are a plurality of spaced apertures 59. Positioned immediately above each of the apertures 59 on a second, upper surface of the circuit board 32 is a conductive mounting spring 50. The conductive mounting spring 50 is helically wound and includes an end portion 50a which is adapted for insertion through a second aperture in the circuit board and for coupling in a conventional manner such as by soldering to one of the conductive strips on the other side of the circuit board as shown in FIGS. 2 and 5, wherein the end portion of the conductive mounting spring is electrically coupled to conductive strip 34. Thus, immediately adjacent to each of the aformentioned first apertures 59 is a respective second aperture through which the end portion of a conductive mounting spring 50 is inserted and securely coupled to one of the conductive strips positioned on the other side of the circuit board. The helically wound conductive mounting spring 50 is adapted to receive the threaded base portion 56a of a lamp 56. The taper of the helically wound conductive mounting spring 50 is matched to the taper of the threads on the base portion 56a of a lamp 56. The threaded base portion 56a serves as one terminal of the lamp 56. The distal end of the mounting spring 50 is preferably provided with a generally 90° bend to ensure more intimate contact with and secure coupling to the conductive lead to which it is soldered.

Also positioned in the housing 44 along the length thereof is a generally concave, unitary reflector 64, a top plan view of which is shown in FIG. 6. The reflector 64 includes a plurality of spaced apertures 66 along the length thereof, each of which is adapted to receive in a tight fitting manner a respective lamp 56 as shown in FIG. 2. The concave reflector 64 is further provided with first and second flanges 64a, 64b on respective lateral portions thereof. With the concave reflector 64 positioned within and along the length of the housing 44, the first and second flanges 64a, 64b of the reflector are positioned upon and supported by the flanges 67a and 67b on the respective upper edge portions of the first and second lateral panels 46a, 46b of the housing. The concave reflector 64 in a preferred embodiment is comprised of ABS plastic and is provided with a chrome-plated, highly reflective surface on the upper, concave portion thereof to enhance the illumination of the lamps inserted within and projecting above the apertures therein. Also in a preferred embodiment, the concave reflector 64 is positioned upon and engages an upper end portion of the threaded base portion 56a of the lamp 56 for securely maintaining each lamp 56 and the circuit board 32 in position within the housing 44. The concave reflector 64 therefore engages the upper edge portions of the first and second lateral panels 46a, 46b of the housing 44 along the length thereof as well as each of the lamps 56 mounted to the circuit board 32.

Positioned upon an upper portion and extending across the slot-like aperture in the housing 44 is an elongated light transmitting cover 72. The light transmitting cover 72 is provided on respective lateral portions and along the length thereof with first and second flanges 72a, 72b. The cover 72 is preferably comprised of Lexan and thus possesses a certain degree of resilience. The first and second flanges 72a, 72b of the cover are adapted to engage respective first and second flanges 67a, 67b of the first and second lateral panels 46a, 46b of the housing 44. The cover 72 engages the upper, facing portions of the housing 44, which in a preferred embodiment is comprised of PVC and thus also possesses a certain degree of resilience, in a snap-acting manner for secure mounting thereon. The cover 72 may be easily removed from the upper portion of the housing 44 and from across the slot-like aperture therein by merely displacing one or both of the flanges 72a, 72b outward and disengaging it from an immediately adjacent flange of one of the lateral panels of the housing. When thus assembled, the combination of the housing 44 and the cover 72 provides a securely coupled assembly in which each of the components therein are coupled to other components to provide a rugged and durable strip lighting arrangement. A Mylar colored gel in the form of an elongated strip 74 may be positioned between the cover 72 and the concave reflector 64 to provide lighting of virtually any color. The mylar strip 74 may be easily replaced with a strip of a different color to facilitate color changes in the strip lighting system.

As described earlier, the threaded base portion 56a of the lamp 56 forms one lamp electrical terminal. A second terminal 56b is located at the lower end of the threaded base portion 56a of the lamp 56. When securely mounted to the circuit board 32 by means of a conductive mounting spring 50, the second terminal 56b of a lamp 56 is positioned immediately above a respective aperture 59 in the circuit board as shown in FIGS. 3 and 5. The center conductive strip 38 does not extend across each of the apertures 59 in the circuit board 32. In order to bridge this gap and to electrically couple the center conductive strip 38 to each of the lamps 56, a bus bar 60 is positioned on the lower surface of the circuit board 32 and in electrical contact with adjacent sections 38a, 38b of the center conductive strip. The bus bar 60 includes a center pin 60a and a pair of end pins 60b extending upward therefrom. Positioned on respective sides of the first aperture 59 and in alignment with the respective sections 38a, 38b of the center conductive strip 38 are a pair of third apertures. The end pins 60b of the bus bar 60 are adapted for insertion within a respective one of the third apertures for facilitating alignment of the bus bar with the center conductive strip 38, with the bus bar maintained in position by soldering each end thereof to a respective section 38a, 38b of the center conductor 38. With the bus bar 60 thus maintained in position and in electrical contact with the two sections 38a, 38b of the center conductive strip 38, the center pin 60a of the bus bar is positioned within the first aperture 59 and in contact with the second terminal 56b of the lamp 56. It is in this manner that the lamp 56 is coupled in circuit with the center conductive strip 38, which in a preferred embodiment is the neutral or common conductor on the circuit board 38. The lamps are thus coupled in parallel to the controller/power supply 82 such that if one lamp burns out, the remaining lamps will remain illuminated. By positioning the mounting springs 50 on a first side of the circuit board 32 and the conductive strips on a second, facing side of the circuit board, the possibility of shorting out a lamp during installation by contacting more than one conductive strip is eliminated.

Thus, each lamp 56 is coupled to the neutral center conductive strip 38 as well as to one of the remaining conductive strips whereby a voltage is applied across the lamp for the illumination thereof. By sequentially providing signals from the controller/power supply 82 to each of the conductive strips 34, 36, 40 and 42, every fourth lamp may be simultaneously illuminated for a short period, followed by illumination of all lamps positioned immediately adjacent to the previously illuminated lamps, and so on, so as to provide a light "chasing" effect. The present invention is not limited to a four lamp, four conductive strip arrangement, but contemplates the use of virtually any number of lamps in the sequencing operation. All of the lamps may also be simultaneously illuminated by appropriate connection to the controller/power supply 82 in a manner well known to those skilled in the art. In addition, immediately adjacent, identical circuit boards may be coupled together by means of the combination of a female connector 76 and a multi-pin male connector 78 as shown in FIG. 4. Finally, a lower portion of the female connector 76 is provided with first and second support flanges 76a, 76b which engage an upper surface of the bottom panel 46c of the housing 44 and provide proper spacing between the circuit board 32 and the aforementioned bottom panel. Similarly, proper spacing between the circuit board 32 and the bottom panel 46c at intermediate locations along the length of the circuit board is provided by the bus bar 60 and the ends thereof which are soldered to associated sections of the center conductive strip 38 as shown in FIG. 3. This arrangement maintains the circuit board 32 in a flat configuration and provides for proper spacing between the circuit board and the bottom panel 46c of the housing 44.

In a preferred embodiment, the controller/power supply 82 includes a transformer (not shown) for converting 110 VAC line power to 24 VAC for energizing the lamps. The aforementioned "chasing" effect may be reversed in direction by merely reversing the polarity of the controller/power supply 82 to the circuit board of the strip lighting system.

There has thus been shown a modular strip lighting arrangement which provides high illumination, a rugged, enclosed housing for isolating the lamps and associated circuitry from the surrounding environment, and affords easy access to the lamps and associated circuitry for maintenance and/or replacement. All of the lamps are securely mounted to a circuit board and are further maintained in position by a single, concave reflector which improves the appearance of the strip lighting arrangement, enhances its illumination and protects the lamps and associated circuitry from impact damage.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

I claim:

1. A strip lighting arrangement comprising:
    an elongated, generally flat circuit board having a plurality of spaced conductive strips aligned along the length thereof;
    an elongated housing having a slot-like aperture along the length thereof and adapted to receive said circuit board within and along the length thereof;
    a plurality of lamps, each lamp including a first terminal forming a threaded lateral base portion of said lamp and a second terminal positioned on the bottom of said lateral base portion of said lamp;
    a plurality of mounting means positioned on and aligned along the length of said circuit board in spaced relation and coupled in circuit to said conductive strips thereon for receiving and engaging a respective one of said lamps for securely mounting on said circuit board and electrically coupling in circuit with said conductive strips each of said lamps, wherein each of said mounting means includes a helical spring for engaging and electrically coupling the first terminal lateral base portion of a respective lamp to a first conductive strip while maintaining the second terminal bottom portion of the lamp in electrical contact with a second conductive strip;
    a concave reflector positioned over the aperture of said housing and extending substantially along the length thereof, said reflector having a plurality of spaced apertures along the length thereof, wherein each aperture is adapted to receive a respective lamp therein; and
    a light transmitting cover positioned over said reflector and along the length of the aperture in said elongated housing, wherein said cover securely engages said housing adjacent to the aperture therein in a snap-acting manner.

2. A strip lighting arrangement as in claim 1 wherein said circuit board includes a plurality of spaced apertures along the length thereof, with each of said apertures positioned adjacent to a respective mounting means for receiving a first terminal of a respective lamp.

3. A strip lighting arrangement as in claim 2 wherein one of said conductive strips is aligned with and extends across each of said circuit board apertures for engaging a first terminal of each of said lamps mounted on said circuit board.

4. A strip lighting arrangement as in claim 3 wherein said one of said conductive strips is a neutral conductor and is electrically coupled to all of said lamps.

5. A strip lighting arrangement as in claim 4 wherein each of said lamps further includes a second terminal forming a base portion of the lamp and wherein said mounting means securely engages the base portion of a lamp for electrically coupling the second terminal thereof to another of said conductive strips.

6. A strip lighting arrangement as in claim 4 wherein said one of said conductive strips is comprised of a plurality of sections, with each of said sections disposed between adjacent apertures in said circuit board, and wherein said one of said conductive strips is further comprised of at least one conductive bus bar extending across one of said apertures and electrically connecting the first terminal of a lamp positioned adjacent to said one of said apertures to respective sections of said conductive strip positioned on said circuit board adjacent to said one of said apertures therein.

7. A strip lighting arrangement as in claim 6 wherein said mounting means are positioned on a first side of said circuit board and said conductive strips are positioned on a second, facing side of said circuit board and wherein said first side of said circuit board is in facing relation with said reflector.

8. A strip lighting arrangement as in claim 1 further comprising connector means positioned on an end of said circuit board for electrically coupling said circuit board to another circuit board.

9. A strip lighting arrangement as in claim 8 wherein said connector means includes a support flange extending therefrom for engaging an inner, lower portion of said housing and maintaining said circuit board in spaced relation therefrom.

10. A strip lighting arrangement as in claim 1 wherein said cover includes first and second flanges on respective lateral portions and extending substantially the length thereof, and wherein each of said first and second flanges is adapted to securely engage a respective lateral portion of said housing adjacent to the aperture therein and substantially along the length thereof.

11. A strip lighting arrangement as in claim 1 wherein said reflector engages each of said lamps for maintaining said lamps and said circuit board fixedly positioned within said housing.

12. A strip lighting arrangement as in claim 1 wherein said concave reflector includes a chrome-plated upper surface.

13. A strip lighting arrangement as in claim 15 wherein lateral portions of said concave reflector are positioned in tight-fitting relation between respective engaged lateral portions of said cover and said housing in securely maintaining said concave reflector in position in said housing.

14. A strip lighting arrangement as in claim 16 further comprising a light transmitting colored element disposed between said reflector and said cover.

15. A strip lighting arrangement as in claim 1 further comprising mounting means positioned on an outer portion of said housing for securely attaching said housing to a support structure.

16. A strip lighting arrangement as in claim 18 wherein said mounting means includes a dual-sided adhesive tape.

* * * * *